United States Patent [19]
Grosjean

[11] 4,093,824
[45] June 6, 1978

[54] RECEIVER HAVING A PHASE-LOCKED LOOP

[75] Inventor: Jon Paul Grosjean, Batavia, N.Y.

[73] Assignee: GTE Sylvania Incorporated, Stamford, Conn.

[21] Appl. No.: 741,897

[22] Filed: Nov. 15, 1976

[51] Int. Cl.² .............................................. H04H 5/00
[52] U.S. Cl. ................. 179/15 BT; 329/122; 325/346
[58] Field of Search ............... 179/15 BT; 329/122, 329/137; 325/346, 36

[56] References Cited

U.S. PATENT DOCUMENTS

| | | | |
|---|---|---|---|
| 3,564,434 | 7/1968 | Camenzind et al. | 329/122 |
| 3,611,168 | 10/1971 | Haggai | 329/122 |
| 3,662,113 | 5/1972 | Von Recklinghausen | 179/15 BT |
| 3,757,244 | 9/1973 | Giger | 329/122 |
| 3,790,714 | 2/1974 | Ohsawa | 179/15 BT |
| 4,035,736 | 7/1977 | Lance et al. | 329/122 |

*Primary Examiner*—Douglas W. Olms
*Attorney, Agent, or Firm*—Norman J. O'Malley; Thomas H. Buffton; John A. Odozynski

[57] ABSTRACT

A receiver incorporating a phase-locked loop to demodulate a signal comprising a plurality of distinct baseband components is disclosed. The loop filter circuit includes an adjustable resistive element for varying the loop damping factor, thereby providing optimum separation of the baseband components. In addition, the loop filter circuit provides a bandpass high-frequency noise output to a noise-activated muting circuit.

1 Claim, 2 Drawing Figures

RECEIVER HAVING A PHASE-LOCKED LOOP

FIELD OF THE INVENTION

This invention relates to receivers having phase-locked loop demodulators and more particularly to receivers for demodulating a signal comprised of a plurality of distinct baseband components, such as broadcast stereophonic receivers.

BACKGROUND OF THE INVENTION

Phase-locked loop demodulators contribute significantly to performance improvements in many types of receiving systems. Particular improvements are conspicuous in FM stereophonic receivers. One of the important performance characteristics of such a receiver is the ability to reduce the FM detection threshold, thereby improving the signal-to-noise ratio on weak signals. This ability is substantially derived from the inherent low pass frequency response characteristic of phase-locked loop demodulators. However, unless this frequency response characteristic is optimized, degradation of the separation between the distinct stereophonic signal components is introduced. Clearly this degradation cannot be eliminated by subsequent receiver stages and will ultimately appear at the receiver output. Known prior art phase-locked loop demodulators do not include circuitry for optimizing stereophonic separation.

Many prior art receivers incorporate noise-activated muting circuits to interrupt the receiver output during the absence of input signals of at least a minimum desired amplitude. These circuits are typically activated by a band-limited or a high pass filtered noise signal outside the spectrum of the desired demodulated signal. Typical prior art noise muting circuits required at least a high-frequency bandpass filter and noise amplifier. Because phase-locked loop demodulators possess a relatively narrow noise bandwidth and provide a reduced high-frequency noise output, additional noise amplification is required for operation with muting circuits.

OBJECTS OF THE INVENTION

Accordingly, it is an object of this invention to provide a receiver including a phase-locked loop demodulator.

It is a further object of this invention to provide demodulation of a signal comprising a plurality of distinct components.

It is a further object of this invention to provide optimum separation of the distinct baseband components.

It is a further object of this invention to provide a receiver including a phase-locked loop demodulator and a noise-activated muting circuit.

It is a further object of this invention to minimize the amount of noise amplification required in the noise muting circuit.

It is a further object of this invention to minimize the amount of filter circuitry required in the noise-muting circuit.

SUMMARY OF THE INVENTION

The above and other objects and advantages are achieved in one aspect of this invention in a receiver having a phase-locked loop for demodulating a carrier signal modulated by a baseband signal consisting of a plurality of distinct signal components. The phase-locked loop includes a loop filter circuit comprising a variable resistive element for effecting adjustable separation of said baseband signals.

In another aspect of this invention the receiver includes a loop filter circuit which includes a series resistive-capacitive branch having a first terminal connected to a voltage controlled oscillator for providing a control signal having a lowpass characteristic with a cutoff frequency at approximately the loop natural frequency, $W_n$, and a second terminal for providing a high-frequency noise signal having a bandpass characteristic with a center frequency at approximately $W_n$, to a noise-activated muting circuit for interrupting an output of said receiver during the absence of an input signal of the desired amplitude.

DETAILED DESCRIPTION OF THE PREFERRED EMBODIMENTS

For a better understanding of the present invention, together with other and further objects, advantages and capabilities thereof, reference is made to the following disclosure and appended claims in connection with the above-described drawings.

Figure 1:
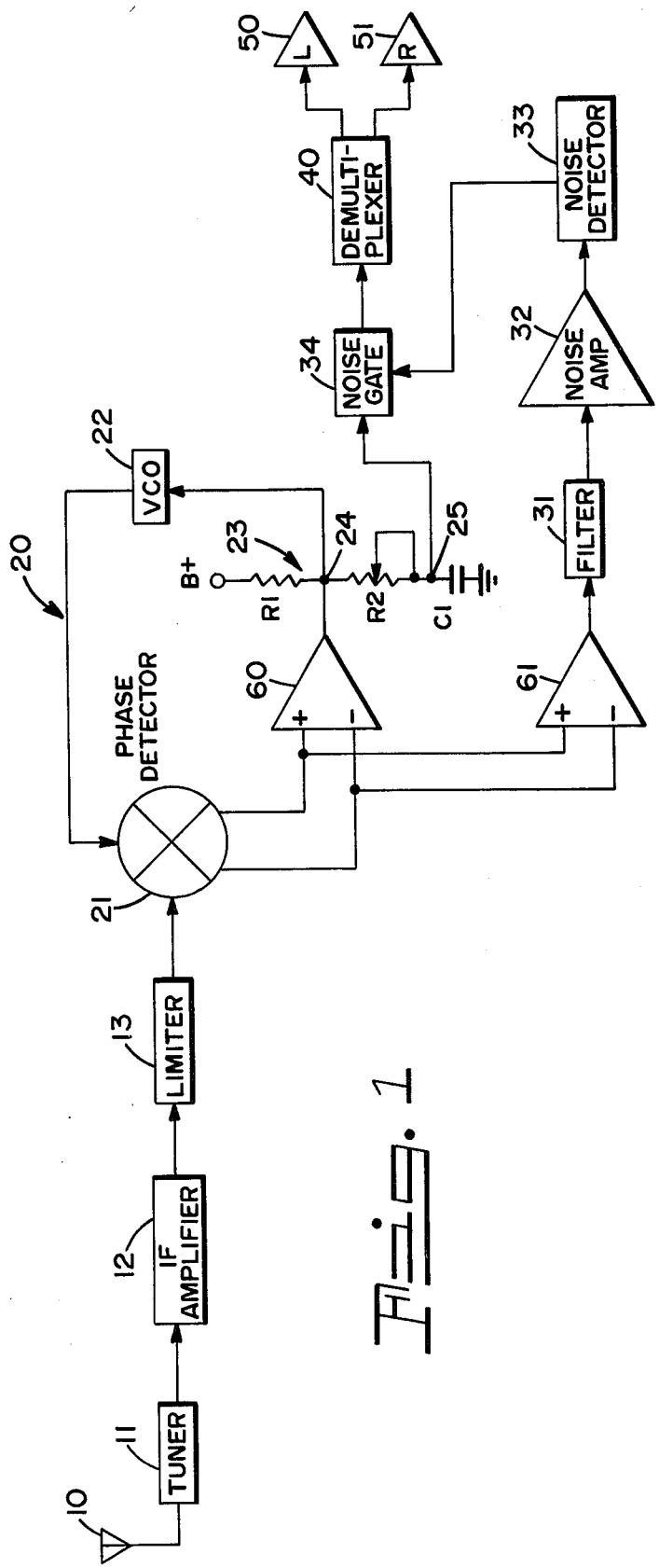
FIG. 1 illustrates a stereophonic receiver incorporating a preferred embodiment of the invention.

FIG. 1 illustrates a broadcast stereophonic receiver comprising the applicant's invention. It will be obvious to those skilled in the art that the invention is useful in other types of equipment as well.

An antenna 10 intercepts a modulated radio frequency carrier signal and couples it to a tuner 11. As is generally known, in a stereophonic system the carrier signal is frequency modulated by a baseband signal including at least an (L + R) signal component occupying a frequency range of approximately 0–15 KHz and an (L − R) signal component translated to the frequency range of approximately 23–53 KHz. Tuner 11 amplifies and converts the radio frequency signal to an intermediate frequency, for example, of 10.7 MHz. An IF amplifier 12 further amplifies and filters the signal providing an output to a limiter 13. Limiter 13 substantially reduces undesired amplitude variations in the signal and assures a relatively constant level signal to a phase-locked loop demodulator 20. Demodulator 20 includes a phase detector 21, a voltage controlled oscillator (VCO) 22 and a loop filter circuit 23. Loop filter circuit 23 includes a resistor R1 connected between a source of potential B+ and VCO 22 input, and a series resistive-capacitive branch comprising a variable resistor R2 and a capacitor C1 connected between VCO 22 input and circuit ground. The loop filter circuit provides, at a terminal 24, a control signal to VCO 22 and, at a terminal 25 a demodulated signal to a noise muting circuit 30. Noise muting circuit 30 comprises a noise filter 31, a noise amplifier 32, a noise detector 33, and a noise gate 34. Muting circuits are well-known and operate to block the demodulated output during the absence of input signals of at least the desired magnitude. The output of muting circuit 30 is applied to a noise gate 34 having an output applied to a demultiplexer 40. Demultiplexer 40 reconstructs, from the (L + R) and (L − R) baseband components, the desired L signal and R signal. These signals are applied to L and R output amplifiers 50 and 51, respectively.

The operation and advantages of phase-locked loops in the demodulation of frequency modulation signals is well documented. (See Gardner, Floyd M.; Phaselock Techniques, John Wiley and Sons, Inc., New York 1967). In addition, the applicant provides analysis and description of the subject invention and particular embodiments thereof in his paper entitled "Phase-locked Loops Using Quadrature Detector Integrated Circuits", appearing in the IEEE Transactions on Consumer Electronics, Volume 22, Number 1, February 1976, pp. 94–98.

As detailed therein, many important receiver operating parameters are determined by the characteristics and components of the phase-locked loop in general and the loop filter circuit in particular. Specifically, the loop transfer function is dependent on the loop natural frequency, $W_n$, and the loop damping factor, $Z$. For a loop filter circuit as in FIG. 1 with R1 much greater than R2:

$$W_n^2 = \text{(approximately) } (K_D K_o)/R1C$$

and $$Z = \text{(approximately) } (W_n R_2 C)/2,$$

where $K_D$ is the phase detector gain constant in (volts)/radian and Ko is the VCO gain constant in (radians/sec.)/volt.

It is a function of stereophonic receivers to demodulate the distinct (L + R) and (L − R) components and from them to reconstruct the L and R stereophonic signals. Ideally, this is accomplished while completely maintaining the separation between the L and R signals. In practice high frequency attenuation and phase non-linearities in the demodulator and errors in the demultiplexer result in some degradation in stereophonic separation.

Clearly any degradation in the separation between the demodulated (L + R) and (L − R) signals will result in degradation in the separation of the reconstructed L and R signals. Furthermore, any adjustable controls included in the demultiplexer circuitry will be largely, if not entirely ineffectual in compensating for a degradation in separation arising during the demodulation process.

However, the frequency response shape of the loop, and hence the separation between the demodulated signal components, is dependent on the loop damping factor Z. Variable resistor R1 controls the loop damping factor in such a manner as to provide optimum separation of the baseband componets, thereby allowing optimum separation of the L and R stereophonic signals. In addition, the component values for R1, R2, and C have been selected to establish a damping factor Z approximately equal to 0.5, thereby effecting a minimum noise bandwidth and optimum receiver sensitivity.

Significantly, in receivers requiring no further complex processing of the demodulated baseband components, for example demultiplexing, optimizing separation in the demodulator substantially optimizes separation for the entire receiver.

One practical embodiment of the circuitry illustrated in FIG. 1 may be partially implemented with the commercially available RCA CA3089E integrated circuit. Although the CA3089E is primarily intended for use with quadrature detector systems, it includes basic blocks useful in phase-locked loop demodulators as well. These blocks are limiter 13, phase detector 21, and amplifiers 60 and 61.

the CA3089E phase detector 21 has a differential output provided to both amplifiers 60 and 61. Amplifier 60 is effectively of the transconductance type, that is, it supplies an output current varying in accordance with its input voltage. Therefore, its input to output voltage gain is proportional to load resistor R1 of the loop filter current.

In order to prevent objectionable noise from reaching the receiver output a noise muting circuit is included in the embodiment of FIG. 1. During the reception of low level signals, the high frequency noise component of the output of phase detector 21 increases. This output is amplified by amplifier 61. Filter 31 selects a high frequency component and applies it to noise amplifier 32. The amplified signal is coupled to noise detector 33 which provides at its output a DC voltage proportional to the input noise amplitude. When the noise amplitude is excessive, the DC voltage serves to disable gate 34, thereby preventing the demodulator output from reaching the demultiplexer and following receiver stages.

Figure 2:
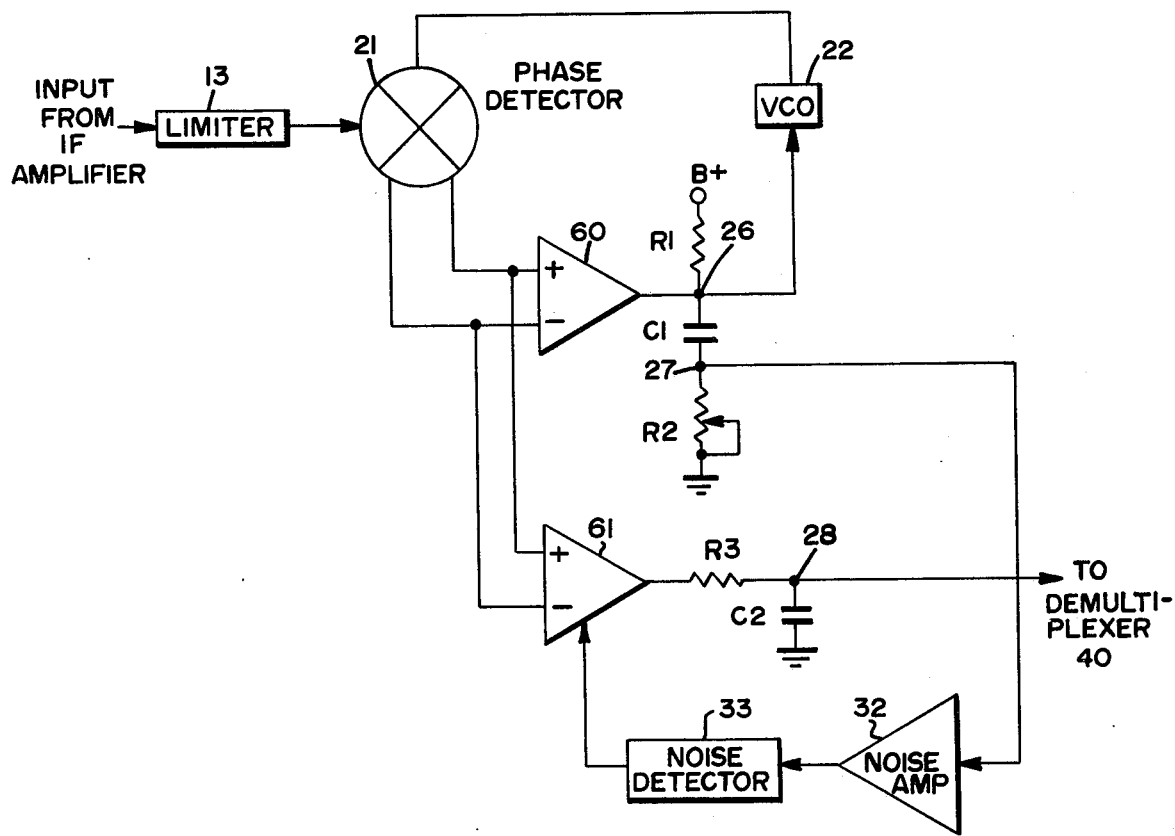
FIG. 2 illustrates a portion of a stereophonic receiver incorporating a second preferred embodiment of the invention.

One advantage of phase-locked loop demodulators is that they possess a more narrow noise bandwidth than other types of demodulators. This results in a higher signal-to-noise ratio in the demodulated output. Although this feature is obviously desirable, it complicates the design of noise muting circuits to the extent that the low noise level at the demodulator output necessitates additional noise amplifiers in order to activate the muting circuit. The loop filter circuit of FIG. 2 circumvents these disadvantages. In FIG. 2 circuit components that can have a form identical to that of FIG. 2 retain their reference numerals. In this aspect of the invention, the positions of C1 and R2 are reversed, R2 being connected between a terminal 27 and circuit ground. A high-frequency noise signal is taken from terminal 27 and applied to the noise-muting circuit.

An analysis of the loop frequency response shows that the transfer function related to the control signal at terminal 26 has a lowpass characteristic with a 3db cutoff frequency related to the loop natural frequency $W_n$. For a loop with a damping factor equal to 0.5, the 3db cutoff frequency is theoretically equal to 1.82 times $W_n$.

Reversing the positions of R2 and C1 in the loop filter circuit, that is, having C1 connected to the VCO input and R2 to circuit ground, provides a signal at terminal 27 described by a transfer function having bandpass characteristics with a center frequency at approximately $W_n$. For the components shown in FIG. 2, the center frequency is approximately 75 KHz. It is desirable to have the input to the noise muting circuit have a bandpass characteristic slightly outside the frequency range of the baseband signal. This obviates the possibility of the muting circuit being activated by the desired baseband signal or by adjacent channel or other spurious signals present at the demodulator output. Prior art phase-locked loop demodulators with an equivalent noise bandwidth provide a lower level noise signal to the muting circuit. In order to enhance the noise output, such demodulators typically broaden the loop noise bandwidth, thereby degrading receiver sensitivity. The loop filter circuit of FIG. 2 maintains a minimum noise bandwidth while simultaneously providing a noise signal having a frequency response desirable for use with muting circuits.

An additional feature of the circuitry of FIG. 2 is the utilization of the DC controlled muting capabilities of amplifier 61. The high frequency noise signal is taken from terminal 27, amplified by noise amplifier 32, rectified by noise detector 33, and applied to the muting input amplifier 61. The demodulated output of amplifier 61 is filtered by R3 and C3 and applied to the demultiplexer for further processing.

In situations where it is either undesirable or unnecessary to use the muting feature of amplifier 61, the demodulated output may be taken at terminal 26 and applied to a separate noise gate.

Accordingly, novel circuitry pertaining to phase-locked loop demodulation in broadcast stereophonic receivers has been illustrated and described. In addition to providing optimum stereophonic separation, the circuitry develops a suitable high frequency noise signal with a minimum of additional amplification and filtering. Clearly this circuitry has analogous utility in other types of receiving systems.

While there has been shown and described what are at present considered the preferred embodiments of the invention, it will be obvious to those skilled in the art that various changes and modifications may be made therein without departing from the scope of the invention as defined by the appended claims.

What is claimed is:

1. In a receiver having a phase-locked loop demodulator comprising a phase detector, a VCO, and a loop filter circuit for demodulating a carrier signal modulated by a baseband signal which is derived from a plurality of distinct signal components and having a demultiplexer for reconstructing said signal components, the loop filter circuit comprising:

a first resistor connected between the input of the VCO and a source of potential voltage;

a resistive-capacitive branch connected between the input of the VCO and circuit ground, said branch comprising a second, variable, resistor and series-connected capacitor, wherein the loop filter circuit is characterized by a damping factor, Z, whose value is determined by the value of the variable resistive element and whereby the value of the variable resistive element is adjusted to effect optimum phase-linearity of the demodulated baseband signal, thereby allowing optimum separation of the reconstructed signal components.

* * * * *